United States Patent [19]

Sano

[11] Patent Number: 5,550,482
[45] Date of Patent: Aug. 27, 1996

[54] PROBE DEVICE

[75] Inventor: Kunio Sano, Nakakoma-gun, Japan

[73] Assignees: Tokyo Electron Kabushiki Kaisha; Tokyo Electron Yamanashi Kabushiki Kaisha, both of Japan

[21] Appl. No.: 274,862

[22] Filed: Jul. 14, 1994

[30] Foreign Application Priority Data

Jul. 20, 1993 [JP] Japan .................................. 5-201096
Aug. 18, 1993 [JP] Japan .................................. 5-225210

[51] Int. Cl.$^6$ ............................ G01R 1/073; G01R 31/02
[52] U.S. Cl. ........................ 324/758; 324/754; 324/760
[58] Field of Search .................................. 324/754, 758, 324/760, 537

[56] References Cited

U.S. PATENT DOCUMENTS

| | | | |
|---|---|---|---|
| 3,596,228 | 7/1971 | Reed, Jr. .................................. | 324/537 |
| 4,616,178 | 10/1986 | Thornton, Jr. et al. .................. | 324/754 |
| 4,757,255 | 7/1988 | Margozzi .................................. | 324/758 |
| 4,899,105 | 2/1990 | Akiyama .................................. | 324/758 |
| 5,077,523 | 12/1991 | Blanz ...................................... | 324/760 |
| 5,225,037 | 7/1993 | Elder et al. .............................. | 324/754 |
| 5,237,267 | 8/1993 | Harwood et al. ........................ | 324/754 |
| 5,304,922 | 4/1994 | Betz et al. ................................ | 324/754 |
| 5,355,079 | 10/1994 | Evans et al. ............................. | 324/158.1 |

*Primary Examiner*—Ernest F. Karlsen
*Attorney, Agent, or Firm*—Beveridge, DeGrandi, Weilacher & Young, L.L.P.

[57] ABSTRACT

A probe device for testing a wafer divided into IC chips has a vessel that accommodates a wafer mounting stand and a flexible probe card having contactor bumps. The vessel is configured in a separatable manner of a grounded aluminum cover portion to which the probe card is integrally fixed and a base portion fixed to the wafer mounting stand. The interior of the vessel is sealed with the wafer and the probe card facing each other therein. A space above the probe card forms a damper chamber into which a fluid is introduced in such a manner that the pressure thereof presses the bumps on the probe card against the wafer. Bumps in a peripheral edge portion of the probe card are placed into contact with electrodes in a peripheral edge portion of the vessel, and thence to a test head. The above configuration can prevent the effects of external electrical noise and thus enable stable electrical measurements unaffected by changes in ambient temperature. In order to remove the effects of thermal expansion of the probe card and the wafer, graticules are formed in each of X and Y directions around an array of bumps. The coordinate positions of the bumps on the probe card under normal temperature conditions are previously stored in a storage unit, the graticules are read by an imaging unit when the probe card has thermally expanded, the current coordinate positional data for the bumps is obtained from the results of this read and the stored bump coordinate positional data, and this is used to control the position of the mounting stand.

6 Claims, 7 Drawing Sheets

FIG. I

PROBE DEVICE

BACKGROUND OF THE INVENTION

The present invention relates to a probe device for performing tests on an object to be tested, such as an IC chip that forms a semiconductor device.

During the process of fabricating a semiconductor device, once the processing of the wafer itself has ended and the IC chips within the wafer have been completed, electrical measurements called probe tests are performed to determine the quality of the IC chips while they are still in semiconductor wafer form, in order to investigate short-and open-circuits between electrodes in the electrode pattern and the input-output characteristics of each IC chip. The wafer is then divided into individual IC chips and the chips that passed these tests are packaged and subjected to further probe tests before their quality as completed products is determined.

A prior art probe device of this type is provided with a wafer mounting stand that is capable of moving in one direction within a horizontal plane (X direction) and another direction that is either perpendicular thereto (Y direction) in that plane or is in the vertical direction (Z direction), and of rotation about a vertical axis. A probe card, which is provided with probe needles that are arrayed to correspond with electrode pads on the chips in the wafer, is arranged above the wafer mounting stand. The configuration is such that, after the wafer mounting stand has been moved to align the electrode pads of the IC chips in the wafer with the probe needles, the probe needles are bought into contact with the electrode pads, the probe needles are placed in electrical contact with a test head via a contact ring comprising pogo pins and so on, and then the quality of each of the IC chips is determined by performing electrical tests using frequencies corresponding to the operating speed of the ICs, for example.

To ensure accurate electrical measurements, the probe needles must be made to come into reliable contact with the electrode pads, and therefore it is necessary to accurately position the electrode pads of the IC chips on the wafer with respect to the probe needles beforehand. Therefore, a device such an optical unit for detecting wafer patterns is provided in a position separated from the test head and the wafer is positioned under the optical unit by moving it in the X and Y directions. The position of the wafer mounting stand is adjusted while the electrode pads are observed through the optical unit, and thus the wafer is positioned in the X, Y, and θ directions, for example.

A burn-in test that detects IC chips that will fail under severe conditions is usually performed after the chips are packaged, but recently it has become common to perform this test while the chips are still in wafer form. In this case, a heater is built into the wafer mounting stand and the measurements are performed while the temperature of the chips is adjusted thereby within a range of, for example, −40° C. to +150° C.

However, as chip sizes become smaller, circuitry becomes more densely integrated, and processing speeds become faster, and as the semiconductor wafers on which large numbers of chips are formed are tending to become bigger in diameter, various defects with the probe device are becoming obvious. For example, the increase in diameter of the wafers makes it necessary to provide a large space for moving the wafer mounting stand, including an area for positioning the wafer, which means that the measurements at low and high temperatures will be affected to some extent by the ambient temperature, and also particles are likely to be generated by the movement of the wafer mounting stand. Another problem concerns LSIs for supercomputers that have operating speeds that are extremely high, such as several tens to several hundreds of MHz. If operating speeds are increased in this manner, the frequency of the signal pulses used during the measurements is also increased, making the device susceptible to electrical noise from the outside. The effects of electrical noise can be suppressed by using a coaxial cable for the pogo pins of the contact ring, but an electrical shielding structure cannot be used for the ends of the pins or the probe needles. These problems have raised the further problem of instability in the electrical measurement of chips.

As chip sizes become smaller and circuitry becomes more densely integrated, the numbers of electrode pads increase and also the sizes of these pads become smaller and the spacing between them becomes tighter, and thus there is the problem that the pitch of the probe needles is approaching a physical limit.

There has recently been studies into the use of probe cards on which are formed bumps that are conductive protrusions of a material such as 18K gold or copper on a thin-film substrate formed of a resin such as a polyimide, as contactors. With such a probe card, tiny bumps can be accurately formed in a predetermined array by using a technique such as printing on an insulating substrate, and there are expectation that this technique will be applied to devices in the future.

However, when a wafer is heated to about 150° C. during burn-in testing, the probe card is also heated and thus the probe card is likely to expand, changing the positions (coordinate positions) of the bumps on the probe card, and thus necessitating detection of these changes and repositioning of the probe card and the wafer after other tests such as normal-temperature tests.

If conventional means were to be adapted for such repositioning, a method could be considered in which two marks attached to the probe card are monitored from below by a camera, a status such as the thermal expansion status of the probe card (or rather the positional status of the bumps) is derived therefrom, and the position of the wafer is adjusted to match the array of bumps. However, the coordinate positions of the bumps extending over the region in which the bumps are arrayed cannot be determined by this method (for example, if the degree of thermal distortion varies locally), and it could happen that not all of the bumps will come into contact accurately with the electrode pads, particularly when there is a large number of bumps and their array density is high. There is also a problem in that labor-intensive work is necessary for previously measuring the coordinate positions of the bumps on the basis of monitor effects for each different type of probe card.

Another method that could be considered involves monitoring all of the bumps with a camera, but the work of checking each bump array is extremely troublesome, and it is difficult to look at all of the bumps to determine their coordinate positional status. Performing high-temperature testing after normal-temperature testing with this method is very inefficient because the same operation must be repeated in a heated status after the wafer has been positioned under normal temperature conditions.

SUMMARY OF THE INVENTION

The present invention was devised in the light of the above described problems with the prior art and has as its objective the provision of a probe device that is capable of preventing the effects of external electrical noise, and is also capable of performing stable electrical measurements, regardless of variations in temperature.

Another objective of the present invention is to provide a probe device that is capable of accurately and simply determining any changes in the coordinate positions of contactors of a probe card, and is also capable of performing highly precise positioning based on this determination.

In order to satisfy the first of the above objectives, the present invention provides a probe device comprising: a mounting stand for holding an object to be tested that has electrode pads; a probe card having contactors which are capable of coming into contact with the electrode pads of the object to be tested held on the wafer mounting stand, and which are arranged facing the object to be tested on the wafer mounting stand; a test head for performing electrical measurements on the object to be tested; means for moving the probe card relative to the wafer mounting stand in such a manner that the contactors are brought into contact with the electrode pads; connection means for electrically connecting the contactors of the probe card to the test head; a vessel for accommodating the wafer mounting stand and the probe card in a sealed status in the interior thereof, and having an electromagnetic shielding capability; and conveyor opening means provided in the vessel in such a manner as to be capable of moving the object to be tested between the interior and exterior of the vessel.

With the above configuration, the object to be tested is conveyed onto the wafer mounting stand after the conveyor opening means of the vessel has been opened, the contactors are brought into contact with the electrode pads of the object to be tested in a status in which the temperature of the object to be tested has been adjusted to a predetermined temperature by means such as a temperature adjustment means built into the wafer mounting stand, and electrical measurements are performed thereon. Since the object to be tested and the probe card are hermetically sealed by the vessel during this time, the effects of the ambient temperature are small and stable, and also they are shielded from external electrical noise, and thus the electrical measurements are stable.

In order to satisfy the second of the above objectives, the present invention provides: a mounting stand for holding an object to be tested that has electrode pads; a probe card having contactors which are capable of coming into contact with the electrode pads of the object to be tested held on the wafer mounting stand, and which are arranged facing the object to be tested on the wafer mounting stand; a test head for performing electrical measurements on the object to be tested; means for moving the probe card relative to the wafer mounting stand in such a manner that the contactors are brought into contact with the electrode pads; connection means for electrically connecting the contactors of the probe card to the test head; graticules extending in one direction on the probe card and another direction perpendicular thereto, on outer sides of a region in which the contactors are arrayed; distinguishing means for distinguishing the graticules; and means for adjusting the position of the wafer mounting stand.

When high-temperature (or low-temperature) testing is performed, the graticules on the probe card are distinguished by the distinguishing means, and current coordinate positional data of the contactors is obtained from this distinguishing result and coordinate positional data of the contactors during normal-temperature measurement, for example. Thus, since coordinate positional data of the contactors extending over the bump array region can be determined accurately, the contactors and the electrode pads can be accurately positioned by controlling the position of the mounting stand for the object to be tested with respect to the probe card, on the basis of this data.

Detailed embodiments of the present invention will now be described below with reference to the accompanying drawings.

DESCRIPTION OF THE PREFERRED EMBODIMENTS

Figure 1:
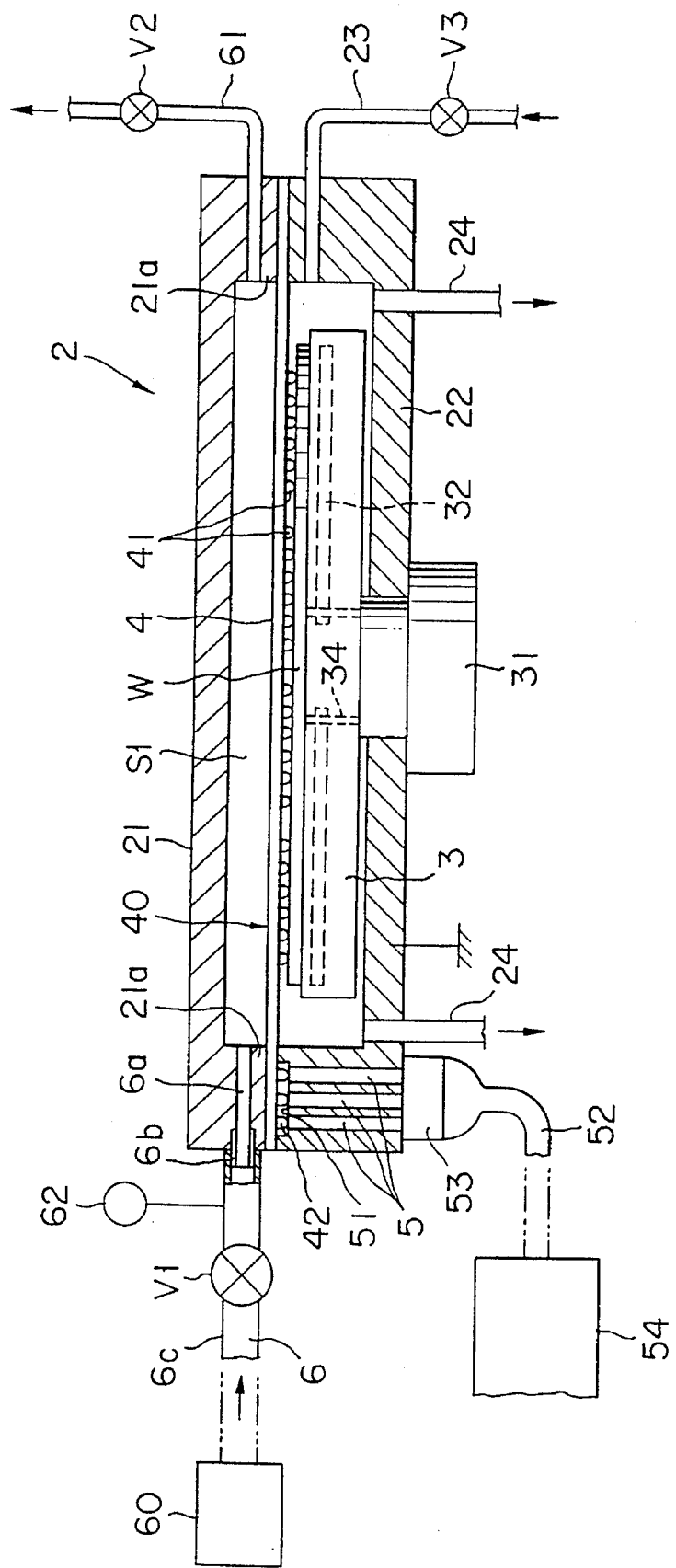
FIG. 1 is a side view in cross-section of the main components of an embodiment of the probe device of the present invention.
Figure 2:
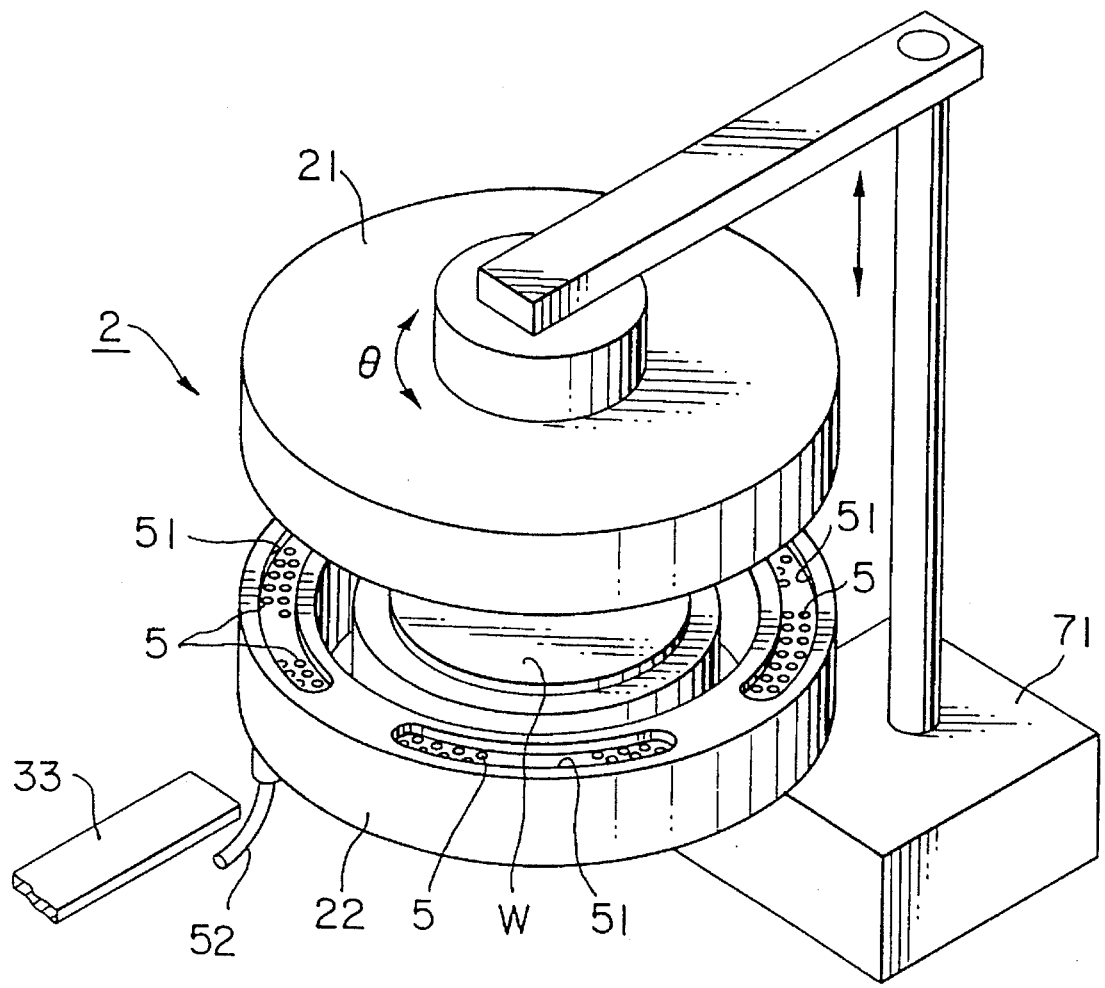
FIG. 2 is a perspective view of the probe device of FIG. 1.

A vertical cross-sectional view of an embodiment of the present invention is shown in FIG. 1, and an abbreviated perspective view thereof is shown in FIG. 2. In these figures, reference number 2 denotes a flattened circular cylindrical vessel made of a material such as aluminum, wherein the vessel 2 is configured to be divided into a cover portion 21 on the upper side thereof and a lower base portion 22, and the vessel 2 is provided with an electromagnetic shielding function by grounding the base portion 22, for example. In order to provide the vessel 2 with the electromagnetic shielding function, the vessel 2 may be grounded via a cable 52 at a test head.

A wafer mounting stand 3 is provided in a space within the vessel 2, and this wafer mounting stand 3 can be driven by infinitesimal amounts in, for example, the X, Y, and θ (rotation about the vertical axis) directions by a known drive mechanism 31 that is provided outside a lower portion of the vessel 2. A temperature adjustment means 32 is built into the wafer mounting stand 3. This temperature adjustment means 32 is a combination of a heating means comprising components such as resistance heaters or Peltier elements and a cooling means such as coolant passages, and can adjust the temperature of a wafer W within the range of, for example, −40° to +150° C. Elevator pins 34 are provided piercing through the wafer mounting stand 3 in order to float the mounting surface of the wafer W when the wafer W is being transferred with respect to a conveyor arm 33, as shown in FIG. 2.

A flexible multi-layer printed circuit board 4, such as a circuit board of a polyimide, is provided adhering to the entire lower surface of the cover portion 21 (in other words, an area extending over a thick peripheral wall portion 21a of the cover portion 21, as well as the opening surface thereof), in such a manner as to hermetically seal off a space S1 within the cover portion 21. Bumps 41 that are contactors such as conductive protrusions corresponding to all of the electrode pads of all the chips on the wafer W are provided on the lower surface side of the multi-layer printed circuit board 4 in such a manner that they come into contact with each of those electrode pads at the same time. Note that the multi-layer printed circuit board 4 is configured of a stack of several wiring layers that are conductive paths, and grounding layers at ground potential are interposed between the upper and lower surfaces of the multi-layer wiring layers. A material such as 18K gold, platinum, rhodium, tungsten, or a nickel alloy could be used for the bumps 41.

Bumps 42 for signal input and output, corresponding to each of the bumps 41, are arranged on an under surface of a peripheral portion of the multi-layer printed circuit board 4 (the area corresponding to the thick peripheral wall portion 21a of the cover portion 21), and these bumps 42 and the bumps 41 are connected together by the circuit layers of the multi-layer printed circuit board 4. The multi-layer printed circuit board 4 and the bumps 41 and 42 together constitute a probe card 40 of this embodiment.

Electrode portions 5 formed of conductive paths corresponding to the bumps 42 are provided piercing a thick peripheral portion of the base portion 22, in a region corresponding to the signal input-output bumps 42, and a depression 51 that accommodates the bumps 42 is formed in a region for the electrode portions 5 in the upper surface of the base portion 22. A connector 53 provided at one end of the cable 52 is connected to a lower end of the electrode portions 5, and the other end of the cable 52 is connected to a test head 54. Thus the configuration is such that the bumps 41 that are the contactors on the probe card 40 are connected to the test head 54 along a path consisting of the multi-layer printed circuit board 4, the bumps 42, the electrode portions 5, the connector 53, and the cable 52.

A fluid supply path 6 and a fluid exhaust path 61, provided with valves V1 and V2, respectively, penetrate through the peripheral wall portion 21a and are connected to the inner space S1. Taking the fluid supply path 6 side as an example, note that each of these pipeways is configured in such a manner that it is formed of a through passage 6a, a connection port 6b, and a pipe 6c. On the supply side of the fluid supply path 6 is connected a fluid-pressure source 60, where the fluid is a gas or a liquid, and temperature adjustment portion (not shown in the figures) for adjusting the temperature of the fluid to a predetermined level. A pressure gage 62 is attached to the fluid supply path 6, and the configuration is such that the pressure of the fluid within the inner space S1 is adjusted by controlling the fluid-pressure source 60 on the basis of a pressure signal from the pressure gage 62. In other words, the inner space S1 is designed to act as a damper chamber, so that the fluid presses on the flexible multi-layer printed circuit board 4 and thus the bumps 41 are pressed firmly into contact with the wafer W.

In a similar manner, a fluid supply pipe 23 and a fluid exhaust pipe 24, provided with valves V3 and V4 (not shown), respectively, penetrate through a wall portion of the base portion 22 and open into a space below the probe card 40, so that a gas or an inert gas for temperature adjustment flows therethrough into the space. The vessel 2 is provided with a separating mechanism in order to separate the upper and lower parts, i.e., the cover portion 21 and base portion 22, and this separating mechanism is provided with, as shown for example in FIG. 2, an elevator device 71 for raising and lowering the cover portion 21 and a rotational device 72 for rotating the cover portion 21 by infinitesimal amounts in the θ direction. The rotational device 72 can be used when probe cards 40 are exchanged, for example, to position the new probe card 40 in the peripheral direction. Note that in this embodiment the spacing formed when the vessel 2 has been separated becomes the opening for transferring the wafer W.

The operation of the above described embodiment will now be described. First the cover portion 21 is separated from the base portion 22 by being raised by the elevator device 71 shown in FIG. 2, and a wafer W is transferred to the elevator pins 34 above the wafer mounting stand 3 from the conveyor arm 33. The cover portion 21 is then lowered, the cover portion 21 and the base portion 22 are then superimposed with the multi-layer printed circuit board 4 therebetween, as shown in FIG. 1, and thus the wafer mounting stand 3 and the probe card 40 are sealed into the vessel 2.

The wafer mounting stand 3 has already been preheated by, for example, the temperature adjustment means 32, and this heats the wafer W to, for example, 120° C. while a fluid such as a gas that has been adjusted to a predetermined temperature and a predetermined pressure is supplied into the inner space (the damper chamber) S1 by the fluid supply path 6 to press against the probe card 40. This presses the bumps 41 arrayed within the probe card 40 against the electrode pads of all the chips of the wafer W, to bring them all into contact at the same time. In this embodiment, a gas that has been adjusted to a predetermined temperature is also made to flow by the fluid supply pipe 23 and the fluid exhaust pipe 24 through the space in which the wafer mounting stand 3 is provided, and thus the temperature of the wafer W is kept even more stable.

In this case, positioning is done before the bumps 41 and the electrode pads of the wafer W come into contact. This positioning could be done by using an optical unit that can simultaneously capture images of the probe card 40 and the wafer W between the cover portion 21 and the base portion 22 while the vessel 2 is open, as will be described later, or by attaching a camera to the upper wall of the cover portion 21 and forming part of the circuit board 4 to be transparent so that images of the bumps 41 and the electrode pads can be simultaneously captured. After a discrepancy in positioning between the probe card 40 and the wafer W is detected, the drive mechanism 31 can be used to move the wafer mounting stand 3 in the X, Y, and θ directions to position it.

When the cover portion 21 and the base portion 22 are superimposed, the peripheral edge bumps 42 and the electrode portions 5 come into contact, so that the electrode pads of the chips on the wafer are electrically connected to the test head 54 through each of the bumps 41, as described previously. The test head 54 sends predetermined pulse signals to the chips on the wafer in this status, and determines the quality of the chips from output pulse signals returned from the chips. Subsequently, the gas within the damper chamber S1 is then exhausted through the fluid exhaust path 61 and, at the same time, the supply of gas from the fluid supply pipe 23 is stopped. The cover portion 21 is then raised and the wafer W is transferred to the conveyor arm 33.

Since the probe card 40 and the wafer mounting stand 3 are sealed into the vessel 2 in accordance with the above described embodiment, the temperature of the wafer W is not readily affected by the ambient temperature, even when it is adjusted to either a high temperature or a low temperature, and, since the volume therein is small, the rise and fall in temperature is fast. Since the vessel 2 has an electromagnetic shielding capability, the wafer W is shielded from external electrical noise, and thus stable measurements can be performed.

Since the configuration is such that the bumps 41 are brought into contact with the electrode pads of all the chips at the same time, the wafer mounting stand 3 need only have a structure that can move through just the amount required for positioning, and thus the overall device can be made smaller. Similarly, since there is now no need to make the contactors come into contact sequentially with the chips, the throughput is improved. In addition, since the bumps are pressed onto the wafer W by the pressure of the fluid, such as a gas, introduced into the damper chamber S1, this pressure can be easily adjusted and also, since the temperature of the fluid can be adjusted, the wafer is even less likely to be affected by the ambient temperature.

In the above embodiment, the material of the vessel 2 is not limited to aluminum; it could have any configuration such that it is grounded and uses another metal, provided it has an electromagnetic shielding capability. It need not even be of metal, but of a conductive plastic or of a metal foil attached to an insulating frame. In order to convey the wafer W into the vessel 2, the vessel 2 need not be split; for example, a wafer conveyor port could be formed in a side wall which can be closed by a gate.

Instead of introducing a fluid into the damper chamber S1 in order to press down the probe card 40, mechanical means such ball screws and springs could be used, and the temperature adjustment means for the wafer W could be configured of a heater or the like incorporated into the vessel 2.

Note that probe needles could be used as the contactors in the present invention. Note also that the present invention could be applied to a device that brings bumps or probe needles sequentially into contact with bumps, or a probe device that does not perform any temperature adjustment of the object to be tested.

Another embodiment of the present invention will now be described with reference to FIGS. 3 and 4. In this embodiment, a positioning unit 8 is provided between the cover portion 21 and the base portion 22 of the vessel 2 that has been separated vertically. The positioning unit 8 can be freely moved to and fro by a movement mechanism (not shown in the figures) that is capable of driving in, for example, the X, Y, and Z directions. The positioning unit 8 has a holder frame 81 configured in a shape that conforms to the cover portion 21 and the base portion 22, and which can be interposed and attached therebetween; X-axis guide rails 82 provided so as to extend in the X direction along side edges of the holder frame 81; Y-axis guide rails 83 that extend in the Y direction, guided by the X-axis guide rails 82; and a camera unit 9 that is an optical unit attached to a jointed arm 84 guided along the Y-axis guide rails 83. The camera unit 9 is moved in the X and Y directions by the jointed arm 84.

Figure 5:
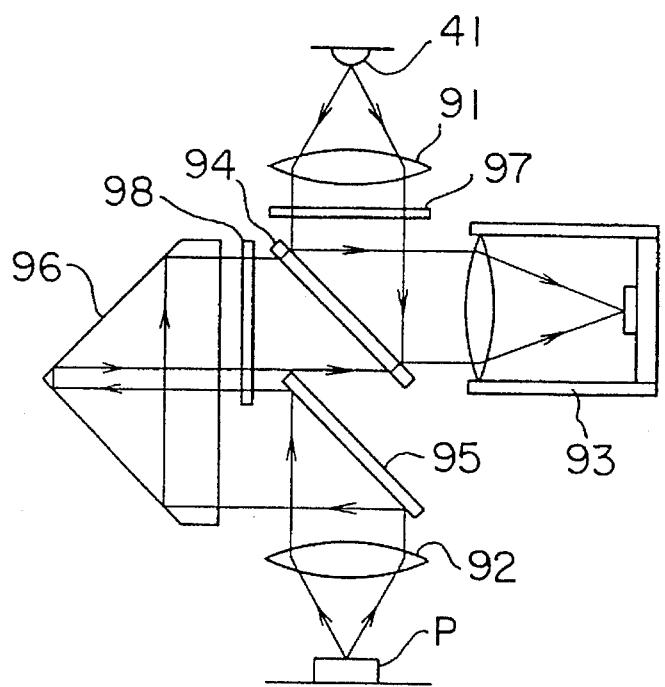
FIG. 5 is a side view of a camera unit that can be used in the probe device of FIG. 3.

As shown in FIG. 5, the camera unit 9 has an objective lens 91 for the bumps 41 and an objective lens 92 for electrode pads P, a camera 93 for imaging the bumps and electrode pads P, a half mirror 94 for reflecting the image from the upper objective lens 91, a half mirror 95 and prism 96 forming an optical path from the lower objective lens 92 to a rear surface of the half mirror 94, and shutters 97 and 98 for independently opening and shutting the optical paths from the upper objective lens 91 and the lower objective lens 92. Note that the device in FIG. 3 is also provided with the drive mechanism 31 for the wafer mounting stand 3 and the fluid supply path 6 shown in FIG. 1, but they are not shown in FIG. 3.

In the embodiment as configured above, after the wafer W is placed on the wafer mounting stand 3, the positioning unit 8 is interposed between the cover portion 21 and the base portion 22 and is sandwiched therebetween to hermetically seal an interior space thereof. The camera unit 9 is used to position the probe card 40 and the wafer W.

Figure 6A:
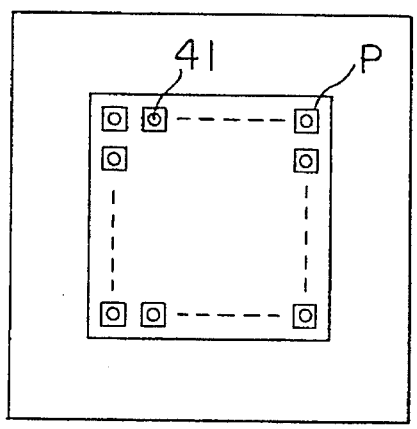
FIG. 6A and FIG. 6B are diagrams illustrative of examples of the images seen by the camera unit.
Figure 6B:
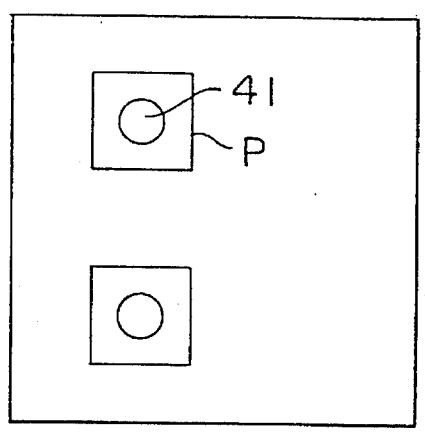

This positioning could be performed by capturing images of the bumps 41 and the electrode pads P, for example, at a low magnification and then at a high magnification, as shown in FIG. 6A and FIG. 6B, with the operator using these images as a basis for moving the wafer mounting stand 3. Alternatively, it could be performed by using a plurality of cross-marks provided at several places on the probe card 40 and the wafer W for the positioning.

With the above described configuration, since the surfaces of the probe card and the wafer are monitored simultaneously, and thus positioning can be done in real time, highly precise positioning can be implemented without being affected by errors caused by mechanical control systems. Since the probe card and the wafer can be positioned while in a sealed status, highly precise positioning is enabled, even at high or low temperatures.

In either of the embodiments described above, since the mounting stand for the object to be tested and the probe card are sealed into a vessel that is provided with an electromagnetic shielding capability, they are not readily affected by external electrical noise, and thus stable electrical measurements can be performed. The ambient temperature also has little effect when the temperature of the object to be tested is being adjusted.

If the configuration is such that all of the electrode pads of the object to be tested are brought into contact with the contactors at the same time, the amount by which the mounting stand for the object to be tested need be moved is kept small, and thus the vessel can be made small. If a damper chamber is formed within the vessel and a fluid is supplied thereto to press down the probe card, pressure adjustment is simple.

If a positioning unit that can be interposed between the probe card and the object to be tested is provided and the configuration is such that images of the contactors and the electrode pads can be captured simultaneously, highly precise positioning can be performed.

Figure 7:
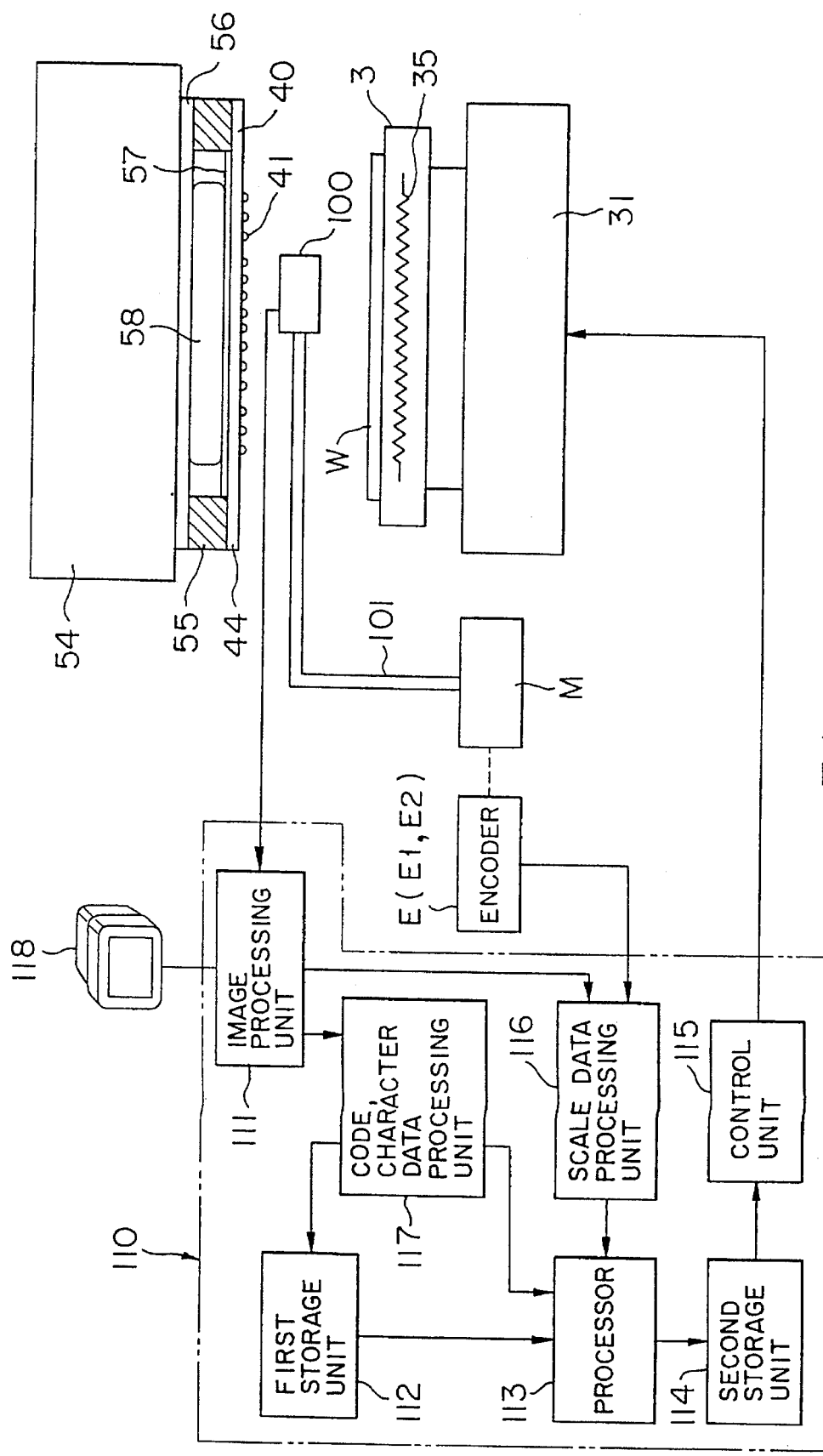
FIG. 7 is a view of yet another embodiment of the probe device of the present invention.

An outline of the configuration of yet another embodiment of the present invention is shown in FIG. 7. Reference numeral 3 in the figure denotes a wafer mounting stand in which is built in a temperature adjustment means comprising a heater 35 and coolant paths (not shown in the figure), with the configuration being such that the temperature of the wafer W can be adjusted within a range of $-40°$ C. to $150°$ C. The wafer mounting stand 3 can be moved by infinitesimal amounts in, for example, the X, Y, and $\theta$ (rotation about the vertical axis) directions by a drive mechanism 31 in the same way as in the previous embodiments, and it can also be raised and lowered between a test position and a transfer position.

Figure 8:
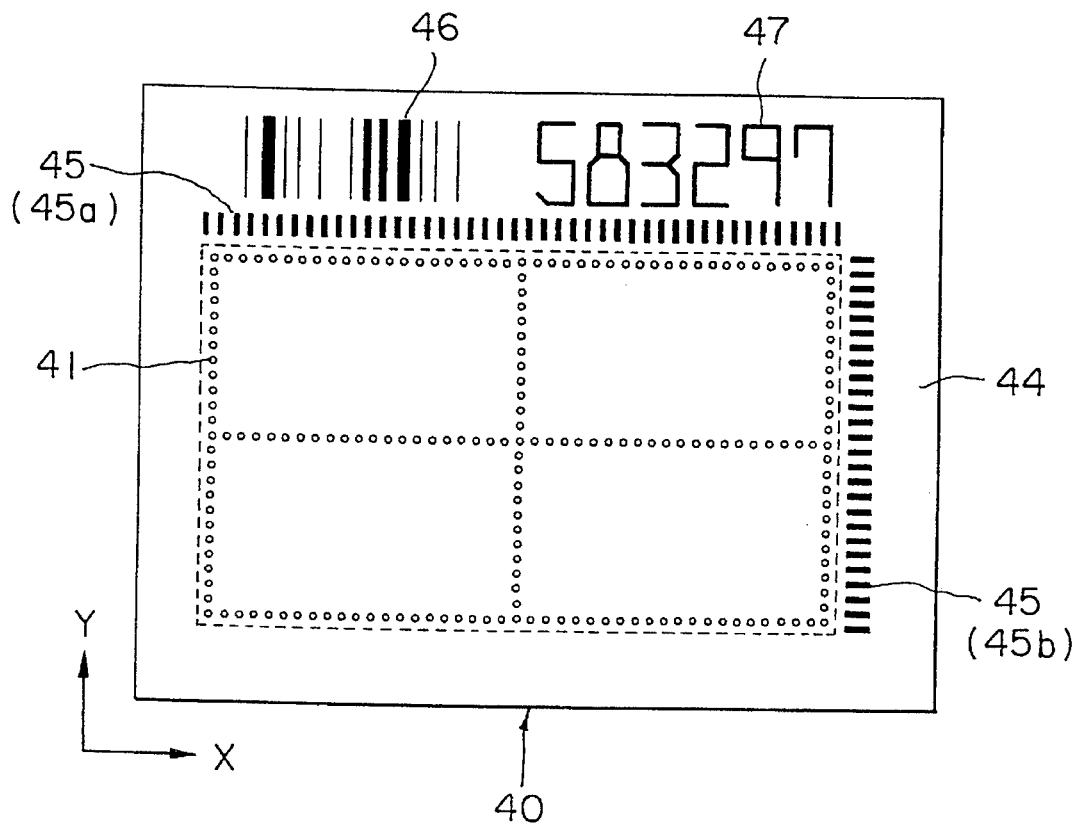
FIG. 8 is a plan view of a probe card used in the embodiment of FIG. 7.

A probe card 40 is provided above the wafer mounting stand 3, facing it. The probe card 40 is provided with a card body 44 of a multi-layer structure of conductive layers that form signal paths within a thin film of, for example, polyimide, and bumps 41 that are contactors such as conductive protrusions are arranged on the lower surface of the card body 44. These bumps 41 are arrayed to correspond with all of the electrode pads of all the chips on the wafer W, as shown in FIG. 8, in such a manner that they come into contact with each of those electrode pads at the same time. These bumps 41 are formed of a material such as 18K gold, platinum, rhodium, tungsten, or a nickel alloy.

Graticules 45 (45a) and 45 (45b) are formed in the X and Y directions on the lower surface of the card body 44 around the periphery of a region in which the bumps 41 are arrayed. In this example, they are formed along one side of a rectangle enclosing the regions in which the bumps 41 are arrayed and another side perpendicular thereto. If the diameter of the bumps 41 is, for example, 50 μm and the pitch thereof is 100 μm, the width of each individual graticule is set to 25 μm and the pitch of the graticules is set to 25 μm. These graticules 45a and 45b can be formed to a highly precise width and pitch in the surface of the polyimide thin film by using an exposure technique during the process of fabricating the probe card that is formed of, for example, the above described thin film. The probe card 40 could be made for a specific type of wafer W, in which case an indication corresponding to the product name of the probe card could be added to the lower surface of the card body 44, in a form such as characters 47 that can be read by an optical character reader.

As shown in FIG. 7, a frame 55 of a rectangular shape corresponding to the probe card 40 is attached to the peripheral edge of the upper surface of the probe card 40, and the frame 55 is attached to a circuit board 56 on a lower surface of a test head 54. Although not shown in the figure, contact bumps that are electrically connected to the bumps 41 via through holes or a conductive layer formed in the polyimide thin film (the card body 44) are arrayed on the peripheral edge of the upper surface of the probe card 40, and these bumps are connected electrically to the circuit board 56 of the test head 54 via a conductive path such as an electrode within the frame 55.

A heater 57 formed of a resistance heating layer in a flexible insulating substrate, for example, is adhered to the upper surface of the probe card 40. A pneumatic mat or rubber shock absorber 58 is inserted in a space in the center of the frame 55, in other words between the probe card 40 and the circuit board 56, in such a manner that it is restrained by its own restoration force, and this is used to make the card body 44 press against the lower surface. In this embodiment, in the same manner as shown in FIG. 1 and FIG. 3, the wafer mounting stand 3 and the probe card 40 can be accommodated in a sealed state between the cover portion 21 and the base portion 22 that are the upper and lower parts of the openable vessel 2.

An imaging unit 100 is provided between the wafer mounting stand 3 and the probe card 40. The imaging unit 100 monitors positioning marks (cross marks or L-shaped marks) formed in the wafer W on the wafer mounting stand 3 and similar positioning marks formed on the probe card 40, and it is also provided in such a manner that it is free to move to and fro to enable monitoring of other marks such as the graticules 45 (45a and 45b) on the probe card 40. The imaging unit 100 may have a configuration similar to that shown in FIG. 5.

The imaging unit 100 is supported by a support mechanism 101 that can be moved in the X and Y directions by a drive mechanism M, and an X-direction motor and a Y-direction motor that configure the drive mechanism M are linked to encoders E (E1 and E2).

The images obtained by the imaging unit 100 are input to an image processing unit 111 within a control unit 110, via an optical path such as an optical fiber. The control unit 110 is provided with a graticule or scale data processing unit 116, a first storage unit 112, a processor 113, a second storage unit 114, a code/character data processing unit 117, and a control unit 115. The image processing unit 111 has the function of converting the images obtained by the control unit 110 into electronic data, and images of the bumps 41 and/or the electrode pads on the wafer W are displayed during a positioning mode by the image processing unit 111 on a separately provided device such as a CRT 118.

Figure 9:
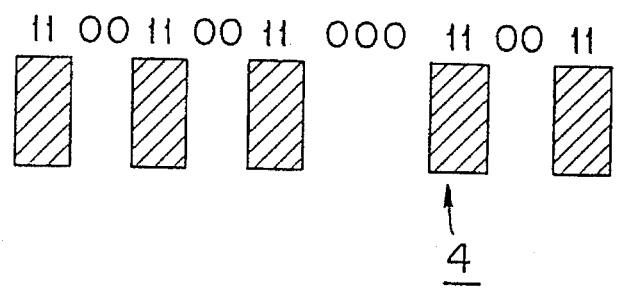
FIG. 9 is a view illustrative of graticules on the probe card and the spacing between them.

Data on the coordinate positions of the bumps 41, in an X-Y coordinate system with respect to the probe card 40 that is different for each probe card 40, is stored in the first storage unit 112. This data gives the coordinate positions of the bumps 41 when the graticules 45 are arrayed under rated conditions (no expansion or contraction). The graticule data processing unit 116 has the function of obtaining the spacing of the graticules in each of the X and Y directions, on the basis of images of the graticules 45a and 45b sent from the image processing unit 111 and pulses from the encoders E1 and E2, as binary graticule data as shown in FIG. 9. In this embodiment, a section for distinguishing the graticules is constituted by the imaging unit 100, the encoders E1 and E2, and the graticule data processing unit 116.

The processor or calculation unit 113 determines the product name of the probe card by deciphering a barcode 46 and OCR characters 47 on the probe card 40 that have been sent through the code/character data processing unit 117. It is provided with a function for reading data on the coordinate positions of the bumps on the probe card corresponding to this product name from the first storage section 112, and a function for calculating the current coordinate positions of the bumps on the basis of the data from the graticule data processing unit 116 and the bump coordinate positions read from the first storage unit 112, then storing that data in the second storage unit 114.

The control unit 115 has the function of moving the wafer mounting stand 3 on the basis of the current coordinate positions of the bumps stored in the second storage section 114 and the coordinate positions of the electrode pads on the wafer W, in such a manner that the position of the wafer W is optimized with respect to the probe card 40, or rather, that the all of the bumps are brought securely into contact with the electrode pads under the current conditions (for example, when the probe card is being heated).

The operation of the above embodiment will now be described. First the heater 35 in the wafer mounting stand 3 and the heater 57 for the probe card 40 are turned on and the wafer W and the probe card 40 are heated to, for example, 150° C., then the wafer W is placed on the wafer mounting stand 3. The imaging unit 100 is then inserted between the wafer W and the probe card 40, an image of the positioning marks formed on the wafer W at, for example, two predetermined positions is obtained by the imaging unit 100 and displayed on the CRT 118, and the operator moves the wafer mounting stand 3 manually so that the marks appear at predetermined positions on screen.

Each of the graticules 45a and 45b on the probe card 40 is then monitored from one end to the other, and the spacings of the graticules are obtained via the graticule data processing unit 116 by the processor or calculation unit 113. At the same time, the barcode 46 and OCR characters 47 on the probe card 40 are imaged by the imaging unit 100 then deciphered by the code/character data processing unit 117, and the coordinate positions of the bumps 41 for the probe card corresponding to the product name are read out of the first storage section 112. The calculation unit 113 obtains the current coordinate positions of the bumps 41 on the probe card 40 (which has expanded), on the basis of this data from the calculation unit 113 and the spacings of the graticules, and stores them in the second storage section 114, then the control unit 115 positions the wafer W with respect to the probe card 40, with reference to the data in the second storage unit 114.

Figure 10:
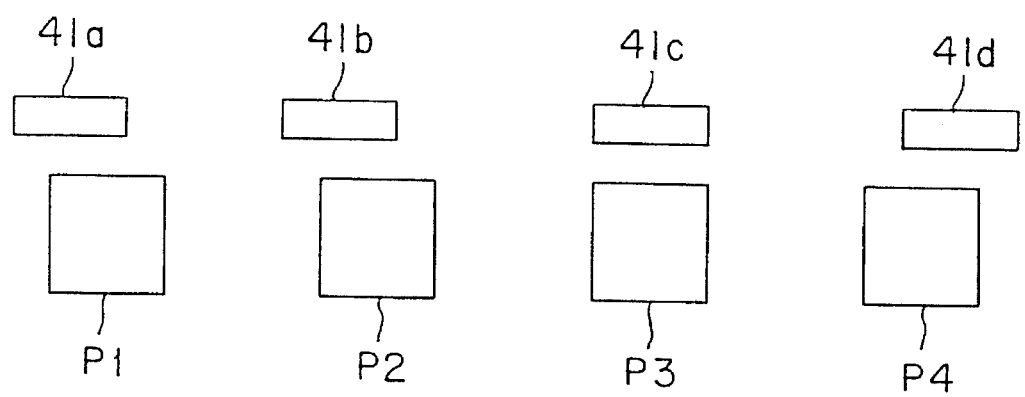
FIG. 10 is a view illustrative of the positional relationship between electrode pads and bumps.

For this positioning, the control unit 115 determines the amounts that the wafer mounting stand 3 should be moved in the X and Y directions to ensure that all of the bumps 41 come into contact with the corresponding electrode pads, on the basis of bump data and coordinate positional data for the electrode pads on the wafer W, and causes the wafer mounting stand 3 by those movement amounts. If the problem shown schematically in FIG. 10 arises in which first to fourth electrode pads P1 to P4 are in the positions shown in FIG. 10 with respect to first and fourth bumps 41a to 41d, the second bump 41b, which is the most displaced with respect to the corresponding electrode pad, can be positioned by driving the wafer mounting stand 3 so that it aligns with the electrode pad P2. After this positioning has been performed, the wafer mounting stand 3 is raised to bring the bumps 41 arrayed on the probe card 40 into contact with the electrode pads of all of the chips on the wafer W into contact at the same time. At this point, the bumps 41 are pressed into contact with the electrode pads of the chips by the restoration force of the shock absorber 58, to ensure a firm electrical contact. Predetermined pulse signals from the test head 54 are applied to the chips on the wafer W, and pulse signals from the chips are input to the test head 54 to determine the quality of each chip.

In accordance with the above embodiment, the graticules 45 (45a and 45b) are recognized or distinguished, and then the coordinate positional data of the bumps 41 when the probe card 40 is thermally expanded are derived from the spacing of the graticules and the coordinate positional data of the bumps 41 when at normal temperature. Therefore, the coordinate positional data of bumps extending over the region in which the bumps are arrayed can be derived accurately. As a result, since it is possible to determine which combination of bumps and electrode pads should be used as reference for the positioning and by how much the wafer mounting stand should be moved to ensure that all of the combinations are positioned in this case, the bumps and the electrode pads of the wafer W can be placed accurately in contact with each other by controlling the position of the wafer mounting stand 3 on the basis of this data. Since the barcode 46 and the OCR characters 47 can be read at the same time, in addition to the distinguishing of the graticules 45 (45a and 45b) alone, the coordinate positional data of the bumps can be determined simply, when the probe card is thermally expanded.

Figure 3:
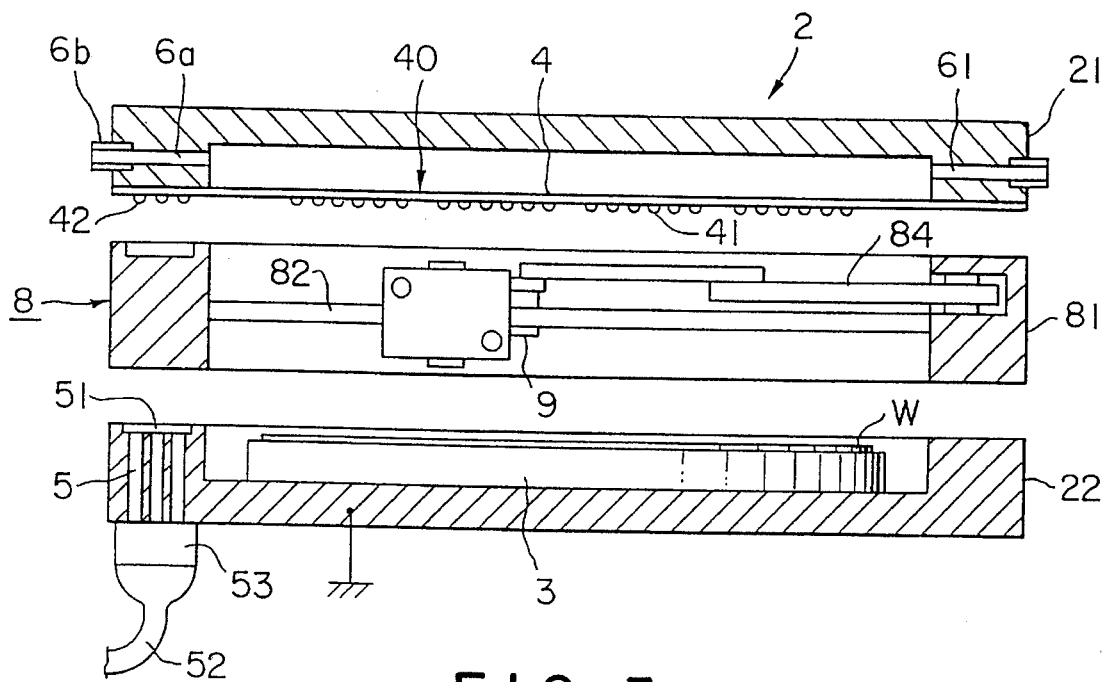
FIG. 3 is a vertical cross-sectional view of the main components of another embodiment of the probe device of the present invention.
Figure 4:
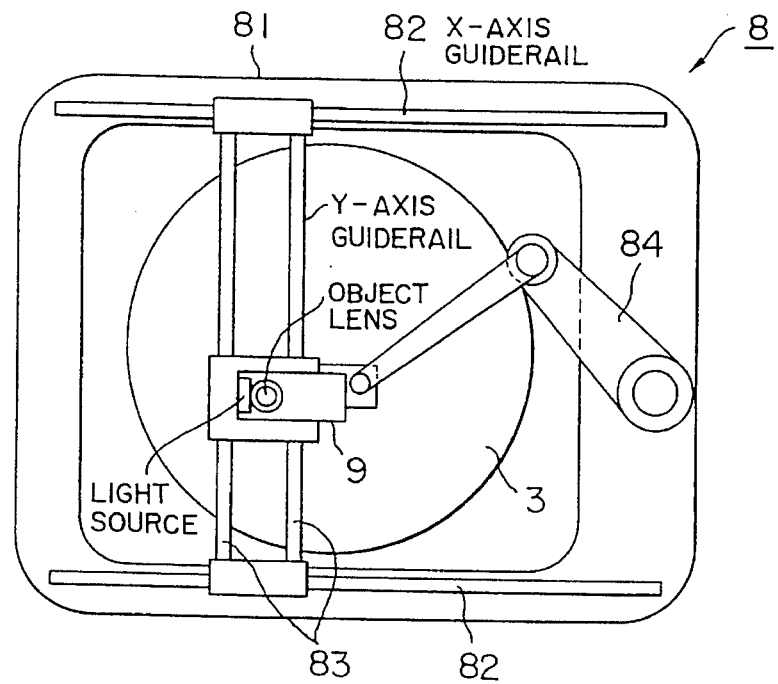
FIG. 4 is a plan view of a positioning unit of the probe device of FIG. 3.

Note that the same mechanism as that shown in FIGS. 3 and 4 can be used as the means of moving the imaging unit 100.

The above described principles of the present invention are not limited to high-temperature testing; they can equally well be applied to low-temperature testing. Similarly, they can also be applied to distinguishing the graticules to check for warping and other distortion of a probe card, to determined whether or not it can still be used. When such a check is performed, the status of the probe card could be determined by only distinguishing the graticules 45.

The bumps are not limited to an array such that they come into contact with the electrode pads of all of the chips on the wafer at the same time; for example, they could be arrayed so as to correspond to the electrode pads of one chip or a small number of chips. Note also that the X and Y directions in which the graticules are arrayed are not limited to mutually perpendicular directions; they could be at an angle to each other.

In accordance with the embodiment shown in FIGS. 7 and 8, since graticules are formed along the edges of the region of the probe card in which the contactors are arrayed, any deformation such as expansion or contraction of the probe card can be easily detected, and thus changes in the coordinate positions of the contactors can be derived. This facilitates accurate positioning of the object to be tested and the probe card, as well as distinguishing of probe cards that are unusable.

By obtaining the current coordinate positions of the contactors on the basis of graticule distinguishing results and previously stored contactor coordinate positional data, the coordinate positions of the contactors can be determined easily and accurately, highly precise positioning is possible, and the contactors and the electrode pattern can be brought into contact securely.

What is claimed is:

1. A probe device, comprising:

a mounting stand for holding thereon an object to be tested, the object having electrode pads such that, when the object to be tested is held on said mounting stand, the electrode pads of the object to be tested face away from said mounting stand;

a probe card provided facing said mounting stand and therefore the electrode pads of an object to be tested held on said mounting stand, the probe card having contactors for contacting the electrode pads of an object to be tested held on said mounting stand;

a test head for performing electrical measurements of an object to be tested held on said mounting stand;

connection means for electrically connecting said contactors of said probe card to said test head;

moving means for moving said probe card relative to said mounting stand such that, when an object to be tested is held on said mounting stand, said contactors are brought into contact with the electrode pads of the object to be tested, thereby causing the electrode pads to be electrically connected to said test head through the contactors and said connection means;

a vessel having an interior accommodating said mounting stand and said probe card in a sealed state, said vessel including
      a first portion supporting said mounting stand; and
      a second portion supporting said probe card, the second portion being relatively movable to and away from said first portion to hermetically close said vessel and to open the vessel so as to allow an object to be tested to be conveyed onto and away from said mounting stand;
      a positioning unit for advancing into and out of a space between said mounting stand and said probe card when said first portion and said second portion are separated to open said vessel; and
      an optical system provided on said positioning unit for transmitting an image of at least one electrode pad of an object to be tested held on said mounting stand, and for transmitting an image of at least one of said contactors of said probe card.

2. A probe device in accordance with claim 1, wherein said mounting stand is positionally adjustable.

3. A probe device in accordance with claim 1, wherein said contactors are shaped as bumps.

4. A probe device in accordance with claim 1, wherein said probe card is a flexible circuit board.

5. A probe device in accordance with claim 4, further including:

damper chamber means formed in said vessel on a side of said probe card opposite to said contactors of said probe card; and fluid supply means for supplying a fluid into said damper chamber means to cause said probe card and said contactors thereof to be pressed, by the pressure of said fluid, against an object to be tested held on said mounting stand.

6. A probe device in accordance with claim 1, further including:

means for supporting said optical system in a freely movable manner with respect to said positioning unit.

* * * * *